United States Patent
Moon et al.

(10) Patent No.: US 9,122,598 B2
(45) Date of Patent: Sep. 1, 2015

(54) SEMICONDUCTOR DEVICE AND OPERATING METHOD THEREOF

(71) Applicant: SK hynix Inc., Icheon-si Gyeonggi-do (KR)

(72) Inventors: Young-Suk Moon, Icheon-si (KR); Hyung-Dong Lee, Yongin Si (KR); Yong-Kee Kwon, Seoul (KR); Hong-Sik Kim, Seongnam-si (KR); Hyung-Gyun Yang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 242 days.

(21) Appl. No.: 13/908,730

(22) Filed: Jun. 3, 2013

(65) Prior Publication Data
US 2013/0326162 A1    Dec. 5, 2013

(30) Foreign Application Priority Data

Jun. 4, 2012    (KR) .......................... 10-2012-0060066

(51) Int. Cl.

| | |
|---|---|
| *G06F 11/00* | (2006.01) |
| *G06F 11/07* | (2006.01) |
| *G06F 12/00* | (2006.01) |
| *G06F 12/08* | (2006.01) |
| *G11C 7/02* | (2006.01) |
| *G11C 7/10* | (2006.01) |
| *G11C 11/406* | (2006.01) |
| *G11C 11/408* | (2006.01) |

(52) U.S. Cl.
CPC ............ *G06F 11/073* (2013.01); *G06F 11/004* (2013.01); *G06F 12/00* (2013.01); *G06F 12/0804* (2013.01); *G11C 7/02* (2013.01); *G11C 7/1006* (2013.01); *G11C 11/4085* (2013.01); *G11C 11/40603* (2013.01); *G06F 2212/3042* (2013.01)

(58) Field of Classification Search
CPC . G06F 11/004; G06F 11/073; G06F 11/3037; G06F 12/00; G06F 12/0804
See application file for complete search history.

(56) References Cited

U.S. PATENT DOCUMENTS

| | | | |
|---|---|---|---|
| 7,212,435 B2 | 5/2007 | Rudeck et al. | |
| 8,923,084 B1 * | 12/2014 | Song | 365/222 |
| 2007/0255889 A1 * | 11/2007 | Yogev et al. | 711/103 |
| 2014/0281766 A1 * | 9/2014 | Yang et al. | 714/721 |
| 2015/0043292 A1 * | 2/2015 | Lee et al. | 365/201 |

\* cited by examiner

*Primary Examiner* — Joshua P Lottich
(74) *Attorney, Agent, or Firm* — William Park & Associates Ltd.

(57) ABSTRACT

A semiconductor device includes a controller configured to control a first memory device to process a request for the first memory device and a second memory device. The controller receives the request for the first memory device, determines a data damage risk of cells connected to a second signal line adjacent to a first signal line of the first memory device corresponding to a requested address by referring to information indicating a data damage risk, and stores data of the cells connected to the second signal line in the second memory device when determining that there is a data damage risk.

18 Claims, 9 Drawing Sheets

FIG. 4

| address | count |
|---------|-------|
| address | count |
| address | count |

· · ·

| address | count |
|---------|-------|
| address | count |
| address | count |

FIG. 5

SEMICONDUCTOR DEVICE AND OPERATING METHOD THEREOF

CROSS-REFERENCE TO RELATED APPLICATIONS

The present application claims priority of Korean Patent Application No. 10-2012-0060066, filed on Jun. 4, 2012, which is incorporated herein by reference in its entirety.

BACKGROUND

1. Technical Field

Embodiments of the present invention generally relate to a semiconductor device and an operating method thereof, and more particularly, to a semiconductor device capable of preventing data of cells from being damaged by word line disturbance of a semiconductor memory device, and an operating method thereof.

2. Related Art

With the increase in the integration degree of a semiconductor memory device, a coupling effect between word lines has increased. Accordingly, when the number of operations for a word line to toggle between an activated state and a deactivated state increases, the data of cells connected to an adjacent word line may be damaged due to a coupling effect between word lines.

For example, in the case of DRAM, electromagnetic waves generated while a word line toggles introduces electrons to the capacitors of cells connected to an adjacent word line or discharges electrons from the capacitors, thereby damaging data.

Such a word line disturbance issue cannot be solved through the conventional technology. For example, in the case of DRAM, data within the cells may be damaged by word line disturbance even before a refresh period. Therefore, the word line disturbance issue cannot be solved through a refresh operation.

SUMMARY

Various embodiments are directed to a semiconductor device capable of preventing cell data from being damage by word line disturbance and an operating method thereof.

In an embodiment, an operating method of a semiconductor device includes: receiving a request for a first memory device; determining a data damage risk of cells connected to a second signal line adjacent to a first signal line of the first memory device corresponding to a requested address, by referring to information indicating a data damage risk; and storing data of the cells connected to the second signal line in the second memory device when determining that there is a data damage risk.

The operating method may further include processing the request on the second memory device instead of the first memory device, when data corresponding to the requested address exist in the second memory device.

The operating method may further include suspending the request for the first memory device when there is the data damage risk.

The operating method may further include resuming processing the request of the first memory device after the storing of the data of the cells in the second memory device.

The operating method may further include updating the information indicating the data damage risk when determining that there is no data damage risk.

The information indicating the data damage risk may be stored in the third memory device.

The first memory device may include a volatile memory device.

When a refresh operation was performed on the first memory device, the information indicating the data damage risk may be invalidated.

The information indicating the data damage risk may include the number of selections for the first signal line.

In the determining of the data damage risk, when the number of selections for the first signal line exceeds a critical point, it may be determined that there is the data damage risk.

The operating method may further include resetting the number of selections for the first signal line when it is determined that there is a data damage risk.

The operating method may further include updating the number of selections for the first signal line when determining that there is no data damage risk.

The information indicating the data damage risk may include a count value for the second signal line.

In the determining of the data damage risk, when the count value for the second signal line exceeds a critical point, it may be determined that there is a data damage risk.

The operating method may further include resetting the count value for the second signal line when it is determined that there is the data damage risk.

The operating method may further include updating the count value for the second signal line when determining that there is no data damage risk.

The operating method may further include may further include resetting a count value for the first signal line when determining that there is no data damage risk.

In an embodiment, a semiconductor device includes: a controller configured to control a first memory device to process a request for the first memory device; and a second memory device. The controller receives the request for the first memory device, determines a data damage risk of cells connected to a second signal line adjacent to a first signal line of the first memory device corresponding to a requested address by referring to information indicating a data damage risk, and stores data of the cells connected to the second signal line in the second memory device when determining that there is a data damage risk.

The controller may process the request on the second memory device instead of the first memory device, when data corresponding to the requested address exist in the second memory device.

The controller may update the information indicating the data damage risk when determining that there is no data damage risk.

The controller may suspend processing the request for the first memory device when there is the data damage risk.

The controller may resume processing the request for the first request device after the data are stored in the second memory device.

The semiconductor device may further include a third memory device configured to store the information indicating the data damage risk.

The first memory device may include a volatile memory device.

The controller may reset the information indicating the data damage risk when a refresh operation was performed on the first memory device.

The information indicating the data damage risk may include the number of selections for the first signal line.

When the number of selections for the first signal line exceeds a critical point, the controller may determine that there is a data damage risk.

The controller may reset the number of selections for the first signal line when determining that there is the data damage risk.

The controller may update the number of selections for the first signal line when determining that there is no data damage risk.

The information indicating the data damage risk may include a count value for the second signal line.

When the count value for the second signal line exceeds a critical point, the controller may determine that there is a data damage risk.

The controller may reset the count value for the second signal line when determining that there is the data damage risk.

The controller may update the count value for the second signal line when determining that there is no data damage risk.

The controller may reset the count value for the first signal line when determining that there is no data damage risk.

The first and second signal lines may include a word line.

In an embodiment, a system includes a semiconductor memory device including a signal line and a control device configured to control the semiconductor memory device. The control device includes a first memory device and a controller. The controller receives a request for the semiconductor memory device, determines a data damage risk of cells connected to a second signal line adjacent to a first signal line of the semiconductor memory device corresponding to a requested address by referring to information indicating a data damage risk, and stores data of the cells connected to the second signal line in the first memory device when determining that there is a data damage risk.

The controller may process the request on the first memory device instead of the semiconductor memory device, when data corresponding to the requested address exist in the first memory device.

The controller may update the information indicating the data damage risk when determining that there is no data damage risk.

The controller may suspend processing the request for the semiconductor memory device when there is the data damage risk.

The controller may resume processing the request for the first request device after the data are stored in the first memory device.

The semiconductor device may further include a second memory device configured to store the information indicating the data damage risk.

The semiconductor memory device may include a volatile memory device.

The controller may reset the information indicating the data damage risk when a refresh operation was performed on the semiconductor memory device.

The information indicating the data damage risk may include the number of selections for the first signal line.

When the number of selections for the first signal line exceeds a critical point, the controller may determine that there is a data damage risk.

The controller may reset the number of selections for the first signal line when determining that there is the data damage risk.

The controller may update the number of selections for the first signal line when determining that there is no data damage risk.

The information indicating the data damage risk may include a count value for the second signal line.

When the count value for the second signal line exceeds a critical point, the controller may determine that there is a data damage risk.

The controller may reset the count value for the second signal line when determining that there is the data damage risk.

The controller may update the count value for the second signal line when determining that there is no data damage risk.

The controller may reset the count value for the first signal line when determining that there is no data damage risk.

The first and second signal lines may include a word line.

In an embodiment, an electronic device includes: a row access controller configured to control a memory cell array to process a request for the memory cell array; and a buffer; wherein the row access controller receives the request for the memory cell array, determines a data damage risk of cells connected to a second signal line adjacent to a first signal line of the memory cell array corresponding to a requested address by referring to information indicating a data damage risk, and stores data of the cells connected to the second signal line in the buffer when determining that there is a data damage risk.

In an embodiment a memory system includes: a semiconductor memory device; and a memory controller including a semiconductor device, the semiconductor device including: a row access controller configured to control the semiconductor memory device to process a request for the semiconductor memory device; and a buffer; wherein the row access controller receives the request for the semiconductor memory device, determines a data damage risk of cells connected to a second signal line adjacent to a first signal line of the semiconductor memory device corresponding to a requested address by referring to information indicating a data damage risk, and stores data of the cells connected to the second signal line in the buffer when determining that there is a data damage risk.

In an embodiment a computing system including a memory system and a central processing unit, the memory system including a memory controller and a semiconductor memory device, and the memory controller includes a semiconductor device, the semiconductor device including: a row access controller configured to control the semiconductor memory device to process a request for the semiconductor memory device; and a buffer; wherein the row access controller receives the request for the semiconductor memory device, determines a data damage risk of cells connected to a second signal line adjacent to a first signal line of the semiconductor memory device corresponding to a requested address by referring to information indicating a data damage risk, and stores data of the cells connected to the second signal line in the buffer when determining that there is a data damage risk.

BRIEF DESCRIPTION OF THE DRAWINGS

FIG. 4 is a block diagram illustrating a counter in accordance with the embodiments of the present invention.

FIG. 5 is a block diagram illustrating a buffer in accordance with the embodiments of the present invention.

DETAILED DESCRIPTION

Figure 1:
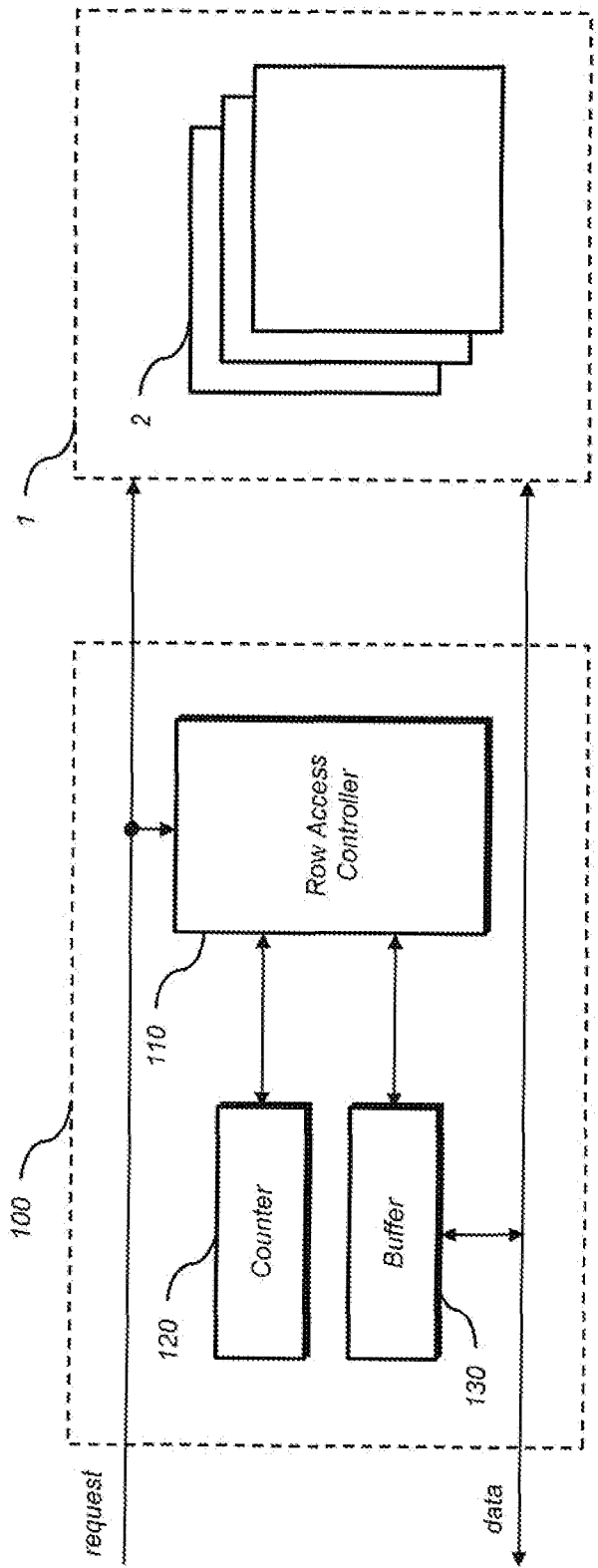
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the embodiments of the present invention, a semiconductor memory device may include a memory cell array including word lines, and the type of the semiconductor memory device is not specified. Therefore, the semiconductor memory device may be configured as a volatile memory device such as DRAM or a nonvolatile memory device such as MRAM, STT-RAM, Flash memory, PCRAM, or ReRAM, etc.

FIG. 1 is a block diagram illustrating an electronic device including a semiconductor device 100 and a semiconductor memory device 1 in accordance with an embodiment of the present invention.

The semiconductor device 100 in accordance with the embodiments of the present invention may be included in a controller such as a memory controller to control a semiconductor memory device 1, or may be implemented separately from the controller.

The semiconductor device 100 in accordance with the embodiments of the present invention may include a row access controller 110, a counter 120, and a buffer 130.

The row access controller 110 may be configured to receive a request for the semiconductor memory device 1 and determine whether or not there is a risk that data of cells connected to a word line adjacent to a word line within a memory cell array 2 corresponding to a requested address will be damaged (hereafter, referred to as a data damage risk), by referring to information indicating the data damage risk.

When determining that there is a data damage risk, the row access controller 110 may control the buffer 130 to store the data of the cells connected to the adjacent word line.

In these embodiments of the present invention, how many times the word line corresponding to the requested address has been selected may be used as the information indicating the data damage risk. That is, the data damage risk is determined based on whether or not the number of selections exceeds a critical point. In an embodiment, the data damage risk of the cells connected to the adjacent word line may be determined based on a different criterion.

In these embodiments of the present invention, the adjacent word line may include one or two word lines next to a word line corresponding to a requested address. In an embodiment, the adjacent word line may include word lines positioned in a predetermined range from a selected word line as well as a word line next to a word line corresponding to a request address. For example, the adjacent word line may include eight word lines, 16 word lines, or a different number of word lines around a selected word line.

In these embodiments of the present invention, the row access controller 110 may process a request on the buffer 130 instead of the semiconductor memory device 1, when data corresponding to the requested address exist in the buffer 130.

That is, word line addresses at which it was determined that there is a data damage risk and data corresponding to the addresses are transferred and stored in the buffer 130, and requests for the corresponding addresses are processed by the buffer 130 instead of the semiconductor memory device 1, while the addresses within the buffer 130 are maintained to be valid.

In these embodiments of the present invention, an experimentally-set value may be used as the critical point serving as a comparison reference value. The critical point may have the same value regardless of the positions of word lines, and may have different values depending on the positions of word lines. Information on the critical point may be stored in the row access controller 110, the counter 120, or another memory device (not illustrated).

In these embodiments of the present invention, the number of selections for a word line is stored in the counter 120. The row access controller 110 may control the counter 120 so as to check the number of selections for a word line corresponding to a requested address. The row access controller 110 may control the counter 120 to update or reset the number of selections for a word line or invalidate the number of selections for a word line.

The specific operation of the row access controller 110 will be described in more detail with reference to FIGS. 6 and 7.

The structure of the counter 120 in accordance with the embodiments of the present invention is illustrated in FIG. 4. The counter 120 may include an address field and a count field.

In these embodiments of the present invention, the address field and the count field store a word line address (row address) of the memory cell array 2 and information on the number of selections (access number) for the corresponding word line, respectively.

In an embodiment, the count field may not store the number of selections for the word line corresponding to the address, but store the number of selections for a word line adjacent to the corresponding word line. In this case, the number of selections for a word line corresponding to a requested address may be checked by referring to a count value for the address of a word line adjacent to the requested address. These embodiments will be described in detail with reference to FIGS. 6 and 7.

Figure 5:
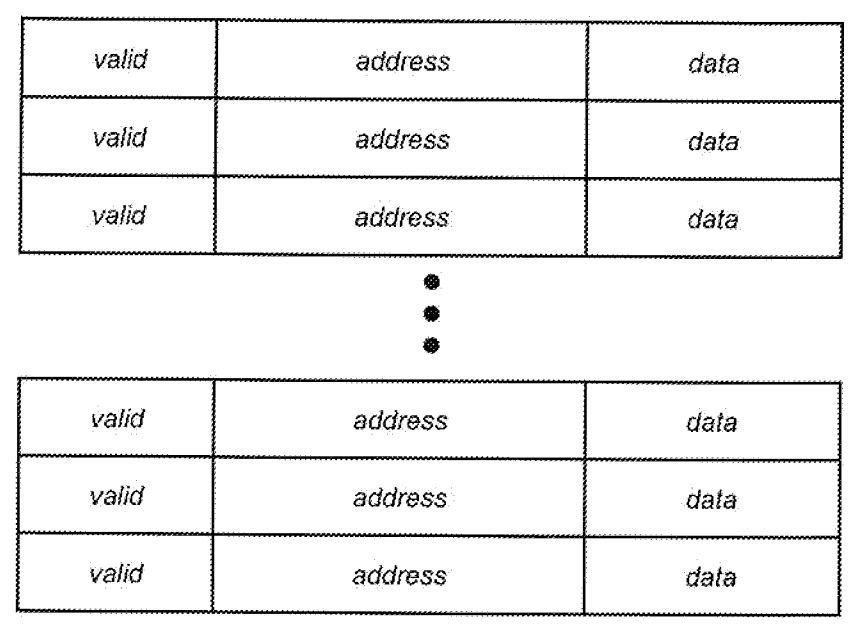

FIG. 5 illustrates the structure of the buffer 130 in accordance with the embodiments of the present invention. The buffer 130 may include a valid field, an address field, and a data field.

The address field and the data field store a word line address (row address) of the memory cell array 2 and data of cells connected to the corresponding word line, respectively.

The valid field indicates whether or not the corresponding line of the buffer 130 contains valid information. Therefore, when new information is to be stored in the buffer 130, a line of which the valid field is deactivated may be first selected. Furthermore, only lines of which the valid fields are activated may be searched to check whether or not the buffer 130 replaces the memory cell array 2 for a requested address.

Figure 2:
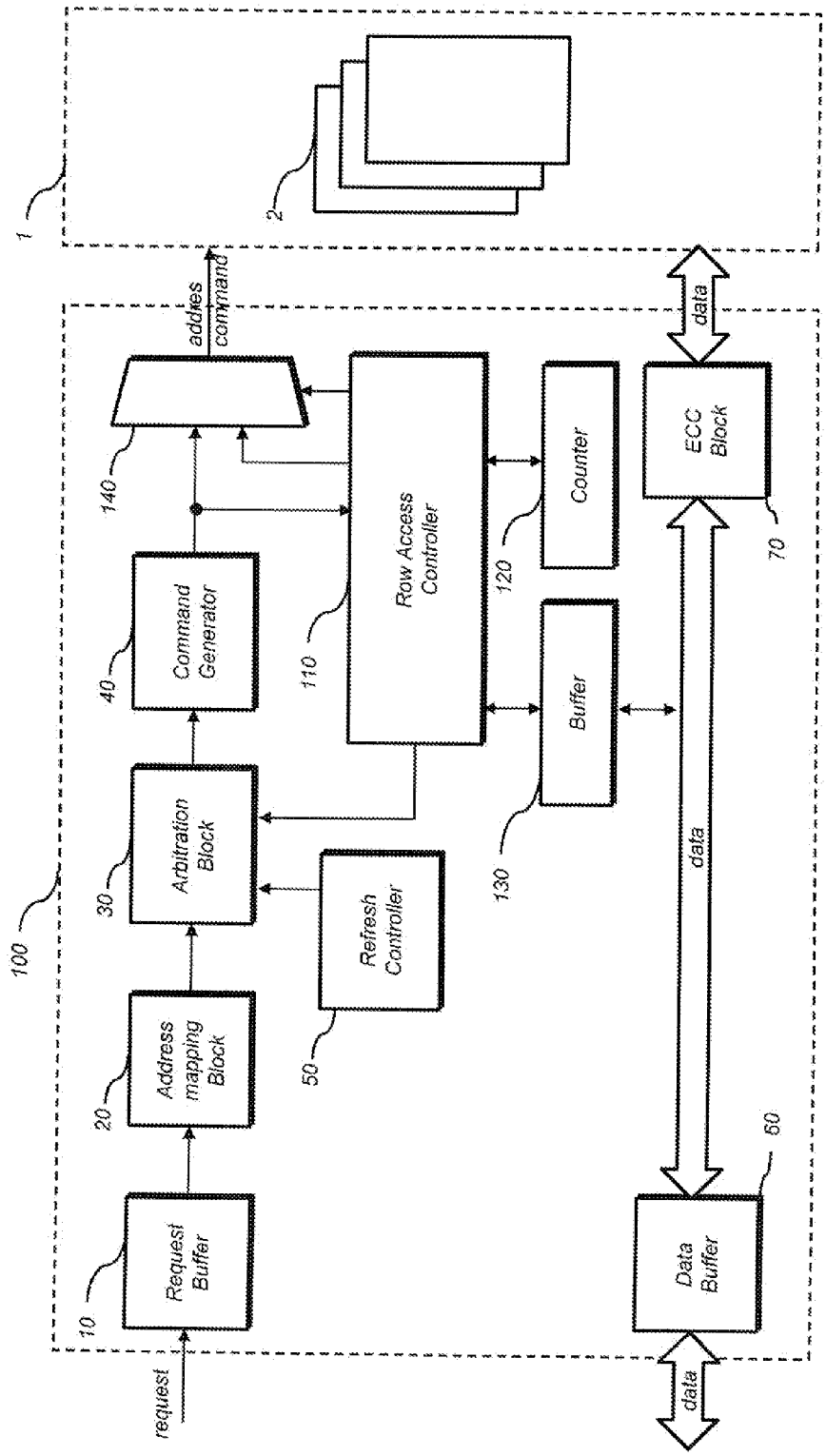
FIG. 2 is block diagram illustrating a semiconductor device in accordance with an embodiment of the present invention.

FIG. 2 is block diagram illustrating a semiconductor device 100 in accordance with an embodiment of the present invention.

In these embodiments of the present invention, the semiconductor device 100 is implemented as a part of a controller to control the semiconductor memory device 1. At this time, the controller may be implemented as a memory controller or CPU, for example, but is not limited thereto.

The semiconductor device 100 in accordance with the embodiments of the present invention may include a row access controller 110, a counter 120, a buffer 130, and a control selector 140.

Furthermore, the semiconductor device 100 in accordance with the embodiments of the present invention may further include a request buffer 10, an address mapping block 20, an arbitration block 30, a command generator 40, a refresh controller 50, a data buffer 60, and an ECC (i.e., error correction code) block 70. The request buffer 10 may be configured to temporarily store an external request. The address mapping block 20 may be configured to convert a requested address into an address of the memory cell array 2. The arbitration block 30 may be configured to set the processing sequence of a plurality of external requests when the plurality of external requests are made. The command generator 40 may be configured to generate a control command for controlling the semiconductor memory device 1 according to a request. The refresh controller 50 may be configured to control a refresh operation of the semiconductor memory device 1. The data buffer 60 may be configured to temporarily store data. The ECC block 70 may be configured to additionally store data parity in the memory cell array 2 and determine whether or not an error exists in data outputted from the memory cell array 2, through the stored parity.

The specific operations of the request buffer 10, the address mapping block 20, the arbitration block 30, the command generator 40, the refresh controller 50, the data buffer 60, and the ECC block 70 are performed in substantially the same manner as those included in a conventional memory controller. Therefore, the detailed descriptions thereof are omitted herein.

The basic operations of the row access controller 110, the counter 120, and the buffer 130 included in the semiconductor device in accordance with the embodiments of the present invention may be performed in the same manner as the embodiments associated with FIG. 1 of the present invention.

When determining that the number of selections for a requested word line exceeds a critical point, the row access controller 110 temporarily suspends a current request, and registers data of cells adjacent to the requested word line in the buffer 130.

For this operation, the row access controller 110 controls the control selector 140 to provide a command and address generated by the row access controller 110 to the semiconductor memory device 1 instead of a control command and address generated by the command generator 40.

As described above, comparing the number of selections for the requested word line to the critical point is one of methods for determining a data damage risk of cells connected to a word line adjacent to the corresponding word line. In an embodiment, a data damage risk of cells connected to an adjacent word line may be determined according to a different method.

When there is no risk that data of cells connected to the adjacent word line will be damaged, the row access controller 110 may control the control selector 140 to provide the control command and address outputted from the command generator 40 to the semiconductor memory device 1.

Furthermore, the row access controller 110 needs to temporarily suspend processing a currently-requested command while the data of the cells connected to the adjacent word line are stored in the buffer 130.

For this operation, the row access controller 110 may provide a signal to the arbitration block 30 to make a request for temporarily suspending the operation. When the operation of storing the data of the cells connected to the adjacent word line in the buffer 130 is completed, the row access controller 110 may provide a signal to the arbitration block 30 to make a request for resuming the suspended operation.

The operation of the arbitration block 30 to temporarily suspend the operation or resume the suspended operation according to a control signal while maintaining a current state may be easily implemented by those skilled in the art, and the detailed descriptions thereof are omitted herein.

Figure 3:
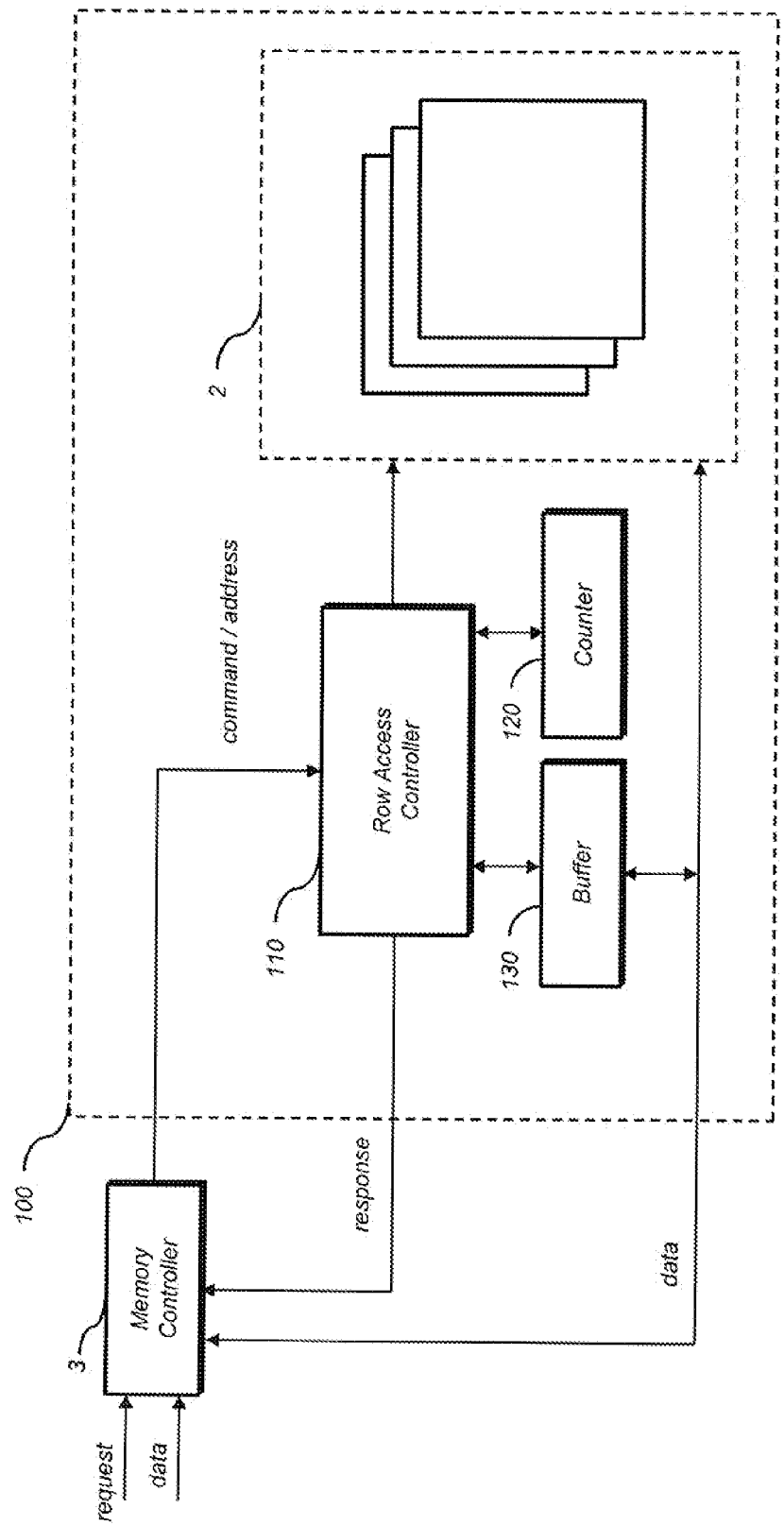
FIG. 3 is block diagram illustrating a semiconductor device in accordance with an embodiment of the present invention.

FIG. 3 is a block diagram illustrating a semiconductor device 100 in accordance with an embodiment of the present invention.

The semiconductor device 100 in accordance with the embodiments of the present invention may include a memory cell array 2 embedded therein. Therefore, the semiconductor device 100 in accordance with the embodiments of the present invention may be referred to as a semiconductor memory device.

Although not illustrated, the semiconductor device in accordance with the embodiments of the present invention may include components required to control general operations of the semiconductor memory device, such as an operation of inputting and outputting data to and from the memory cell array 2 or an operation of refreshing the memory cell array 2.

In FIG. 3, the memory controller 3 generates a control command/address according to an external request, and controls an operation of inputting and outputting data to and from the memory cell array 2 inside the semiconductor device 100 in accordance with the embodiments of the present invention.

Since the configuration and operation of the memory controller 3 illustrated in FIG. 3 are well known, the detailed descriptions thereof are omitted. The memory controller 3 may be independently implemented, and may be included in another component such as a CPU.

The configurations and operations of the row access controller 110, the counter 120, and the buffer 130 in accordance with the embodiments of the present invention are the same as described above.

In these embodiments of the present invention, the row access controller 110 receives a command/address transmitted from the memory controller 3, controls the buffer 130 to check the number of selections for a word line of the memory cell array 2 corresponding to a requested address, and then compares the number of selections to a critical point.

When the number of selections exceeds the critical point, the row access controller 110 may generate a command/address for storing data of cells connected to an adjacent word line in the buffer 130 before processing a request for the word line of the requested address, and may control the memory cell array 2 according to the command/address.

When the operation of storing the data of the cells connected to the adjacent word line in the buffer 130 is completed, the row access controller 110 may process an original request which has been temporarily suspended.

In order to temporarily suspend a current request, the row access controller 110 may request the memory controller 3 to temporarily suspend the operation while maintaining the current request in a queue. This operation may be implemented by temporarily suspending the operation of the arbitration block 30 inside the memory controller as described with reference to FIG. 2. For this operation, the row access controller 110 may provide a response signal for requesting temporary suspension to the memory controller 3.

Then, the row access controller 110 performs an operation of storing the data of the cells connected to the adjacent word line in the buffer 130.

Next, the row access controller 110 may request the memory controller 3 to resume the operation. This operation may be implemented by resuming the operation of the arbitration block 30 inside the memory controller as described with reference to FIG. 2.

For this operation, the row access controller 110 may provide a response signal for requesting resumption to the memory controller 3.

The operation of temporarily suspending and resuming a current request may be embodied in a different manner.

In these cases, the semiconductor device 100 may not provide a response for requesting temporary suspension or resumption to the memory controller 3.

In these cases, the semiconductor device 100 may further include a memory (not illustrated) to temporarily store a command/address received from the memory controller 3 while the data of the cells connected to the adjacent word line are stored in the buffer 130.

Furthermore, the semiconductor device 100 may further include a selector (not illustrated) to selectively apply one of a command received from the memory controller 3 and a command generated from the row access controller 110 to the memory cell array 2.

At this time, the semiconductor device 100 may provide a response signal to the memory controller 3, the response signal indicating that the request for the address requested from the memory controller 3 was completely processed. The memory controller 3 receiving the response signal may provide a command/address for the next request to the semiconductor device 100.

The time required for temporarily suspending a current request, storing data of cells connected to an adjacent word line in the buffer 130, and then processing the current request may differ from the time required for simply processing the current request. In these cases, a response signal may be used for normal interaction with the memory controller 3. However, when there is no problem in timing, a separate response signal may not be provided to the memory controller 3.

Hereafter, an operating method of the semiconductor device in accordance with the embodiments of the present invention will be described with reference to FIGS. 6 and 7.

Figure 6:
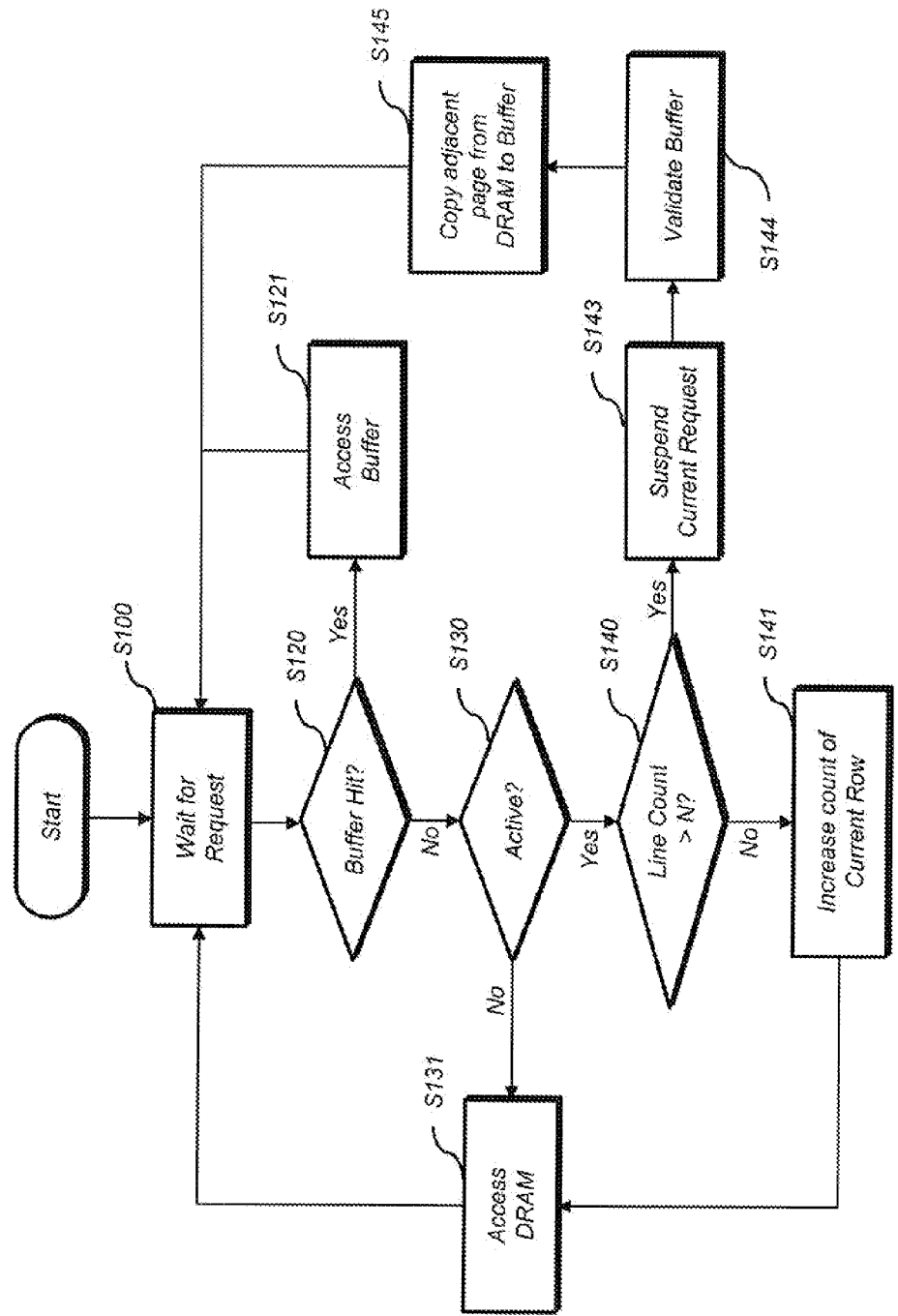
FIG. 6 is a flowchart illustrating an operation method of the semiconductor device in accordance with an embodiment of the present invention.
Figure 7:
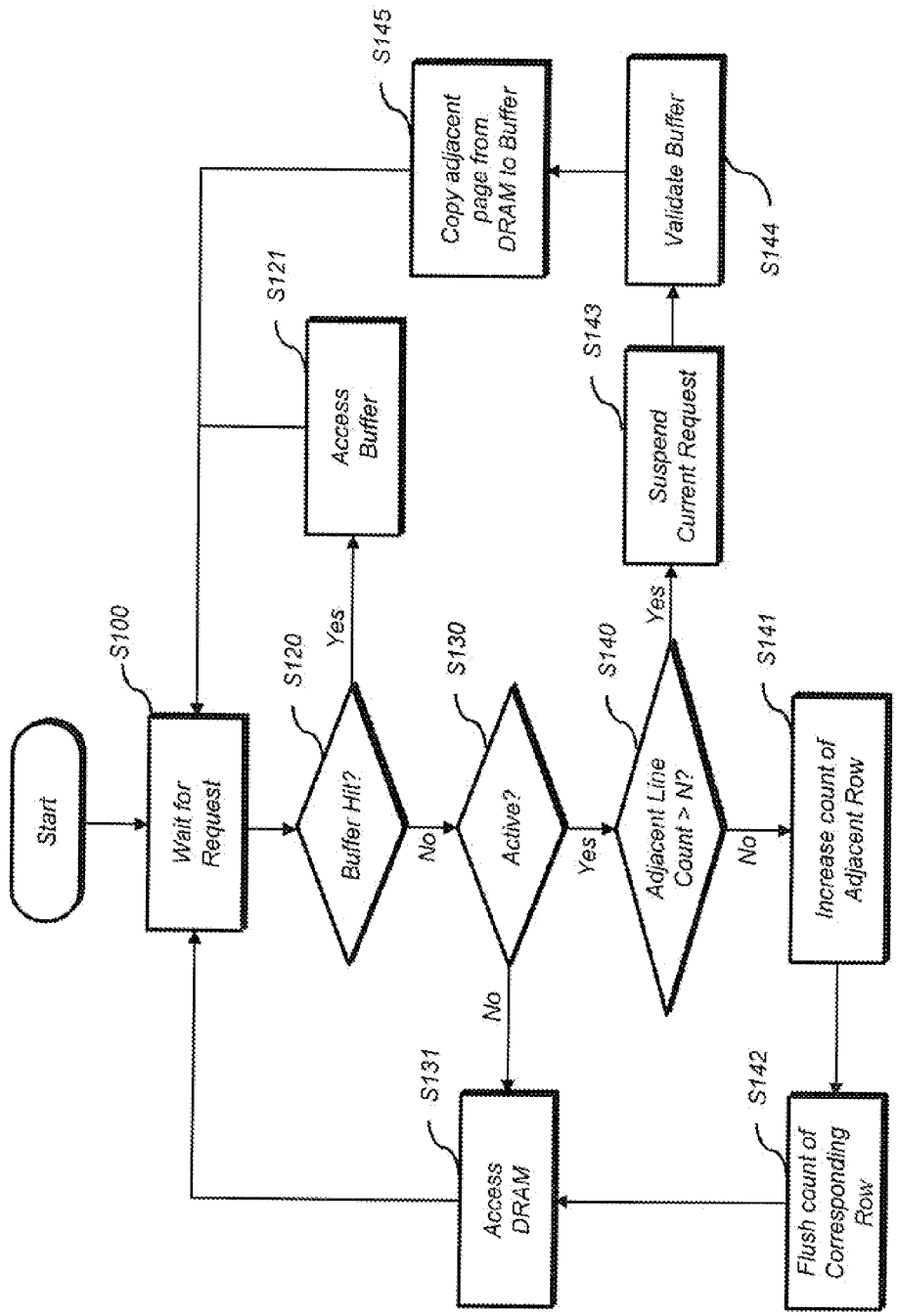
FIG. 7 is a flowchart illustrating an operation method of the semiconductor device in accordance with an embodiment of the present invention.

FIGS. 6 and 7 determine a risk that data of cells connected to a word line adjacent to a word line corresponding to a requested address will be damaged, based on the number of selections for the requested word line.

FIG. 6 illustrates an operation of registering the number of selections for a word line where the value of a count field of FIG. 4 corresponds to the value of an address field. FIG. 7 illustrates an operation of registering the number of selections for a word line adjacent to a word line where the value of a count field of FIG. 4 corresponds to the value of an address field.

FIG. 6 is a flowchart illustrating an operating method of the semiconductor device 100 in accordance with an embodiment of the present invention In these embodiments of the present invention, the number of selections for a word line where the value of a count field corresponds to the value of an address field is registered.

The control operation is performed by the row access controller 110, and the row access controller 110 may control the counter 120 and the buffer 130 to perform operations.

When there is no request, the memory controller 3 waits for a request at step S100. In the embodiments illustrated in FIG. 3, the row access controller 110 waits for a command from the memory controller 3 that first received an external request.

The row access controller 110 determines whether or not a requested address exists in the buffer 130, at step S120 (Buffer Hit?). At this time, the row access controller 110 checks whether or not a corresponding address exists in lines where the valid field of the buffer 130 is activated.

When the requested address exists in the buffer 130 (i.e., Yes), the row access controller 110 processes the request on the buffer 130 instead of the memory cell array 2 at step S121 (Access Buffer).

When the requested address does not exist in the buffer 130 (i.e., No), the row access controller 110 determines whether or not a command corresponding to the received request is a command to activate a word line, at step S130 (Active?). In these embodiments of the present invention, a toggling operation in which a word line is activated and deactivated may be sensed.

Therefore, when the command is not an activation command to change a word line from a deactivated state to an activated state (i.e., No), access to the memory cell array 2 is performed at step S131 (Access DRAM).

In an embodiment, a command to change a word line from an activated state to a deactivated state may be sensed instead of the command to change a word line from a deactivated state to an activated state.

In an embodiment, the command to change a word line from a deactivated state to an activated state or the command to change a word line from an activated state to a deactivated state may be sensed.

In each case, the value of a critical point N serving as a comparison reference at the following step S140 may differ (for example, N may be a natural number).

At the step S140 (Line Count >N?), the row access controller 110 determines whether or not the number of selections for a word line of the memory cell array 2 corresponding to the requested address (word line address, row address) exceeds the critical point N.

Although not illustrated, when the requested address information does not exist in the counter 120, the row access controller 110 may control the counter 120 to register the requested address. At this time, the count value corresponding to the newly-registered address may be reset to 1.

When the number of selections does not exceed the critical point (i.e., No), the row access controller 110 controls the counter 120 to increase the number of selections at step S141 (Increase count of Current Row), and access to the memory cell array 2 is performed at step S131 (Access DRAM).

When the selection number exceeds the critical point (i.e., Yes), the row access controller 110 temporarily suspends a current request for a word line of the memory cell array 2 corresponding to the requested address at step S143 (Suspend Current Request), secures a storage space in the buffer 130 at step S144 (Validate Buffer), and registers the address of a word line adjacent to the corresponding word line and the values of cells connected to the adjacent word line at step S145 (Copy adjacent page from DRAM to Buffer). At this time, the value of the corresponding valid field of the buffer 130 is activated.

In these embodiments of the present invention, the adjacent word line may include one or two word lines next to a word line corresponding to a requested address. In an embodiment, the adjacent word line may include a plurality of word lines positioned in a predetermined range from a selected word line as well as a next word line. For example, the adjacent word line may include eight, 16, or a different number of word lines around the selected word line.

In the embodiments illustrated in FIG. 2, the step S143 of suspending a current request for the word line corresponding to the requested address may be performed as the row access controller 110 temporarily suspends the operation of the arbitration block 30.

An operation of processing the temporarily-suspended current request may be performed immediately after the step S145 of storing the data of the cells connected to the adjacent word line in the buffer, before the loop is ended.

In an embodiment, however, the temporarily-suspended request may not be processed after the step S145, but may be maintained in a queue storing requests so as to be processed at step S131 of the next loop.

When the semiconductor memory device 1 is a volatile memory device such as DRAM, a refresh operation may be performed at a predetermined interval on the entire or a part of the memory cell array 2.

When the refresh operation is performed, the data stored in the buffer 130 may be registered in a corresponding address of the memory cell array 2. Through this operation, the corresponding space of the buffer 130 may be reused.

When the refresh operation is performed, the value of the count field may be reset or deleted.

FIG. 7 is a flowchart illustrating an operating method of the semiconductor device 100 in accordance with an embodiment of the present invention.

In these embodiments of the present invention, the number of selections for a word line where the value of a count field corresponds to the value of an address field is registered.

The control operation is performed by the row access controller 110, and the row access controller 110 may control the counter 120 and the buffer 130 to perform operations.

When there is no request, the memory controller 3 waits for a request at step S100 (Wait for Request). In FIG. 3, the row access controller 110 waits for a command from the memory controller 3 that first received an external request.

The row access controller 110 determines whether or not a requested address exists in the buffer 130 at step S120 (Buffer Hit?). At this time, the row access controller 110 checks whether or not the corresponding address exists in lines where the valid field of the buffer 130 is activated.

When the requested address exists in the buffer 130 (i.e., Yes), the row access controller 110 processes the request on the buffer 130, instead of the memory cell array 2 at step S121 (Access Buffer).

When the requested address does not exist in the buffer 130 (i.e., No), the row access controller 110 determines whether or not a command corresponding to the received request is a command to activate a word line, at step S130 (Active ?). In these embodiments of the present invention, a toggling operation in which a word line is activated and deactivated may be sensed.

Therefore, when the command is not an activation command to change a word line from a deactivated state to an activated state (i.e. No), access to the memory cell array 2 is performed at step S131 (Access DRAM).

In an embodiment, a command to change a word line from an activated state to a deactivated state may be sensed instead of the command to change a word line from a deactivated state to an activated state.

In an embodiment, the command to change a word line from a deactivated state to an activated state or the command to change a word line from an activated state to a deactivated state may be sensed.

In each case, the value of a critical point N serving as a comparison reference at the following step S140 may differ.

At the step S140 (Adjacent Line Count>N?), the row access controller 110 determines whether or not the number of selections for a word line of the memory cell array 2 corresponding to the requested address (word line address, row address) exceeds the critical point N.

In these embodiments of the present invention, the number of selections for the word line corresponding to the requested address may be recognized by checking a count value corresponding to an address corresponding to the word line adjacent to the requested address in the counter 120.

Although not illustrated, when the address information corresponding to the word line adjacent to the requested address does not exist in the counter 120, the row access controller 110 may control the counter 120 to add the address information corresponding to the adjacent word line. At this time, the count value corresponding to the newly-added address may be reset to 1.

When the number of selections does not exceed the critical point (i.e., No), the row access controller 110 controls the counter 120 to increase the count value for the address corresponding to the adjacent word line at step S141 (Increase count of Adjacent Row). Furthermore, while the request for the requested word line is performed, data may be newly registered or existing data may be refreshed. Accordingly, it may be considered that a word line disturbance effect in which the requested word line is influenced by the adjacent word line was completely removed.

Therefore, the row access controller 110 may control the counter 120 to reset the count value corresponding to the address of the requested word line at step S142 (Flush Count of Corresponding Row). In an embodiment, the count value may be invalidated as the counter 120 deletes the address information corresponding to the requested word line.

Then, a current request for the memory cell array 2 is processed at step S131 (Access DRAM).

When the number of selections exceeds the critical point (i.e., Yes), the row access controller 110 temporarily suspends a current request for the word line of the memory cell array 2 corresponding to the requested address at step S143 (Suspend Current Request), secures a predetermined storage space in the buffer 130 at step S144 (Validate Buffer), and registers the address of a word line adjacent to the requested word line and the values of cells connected to the adjacent word line in the secured address and data field at step S145 (Copy adjacent page from DRAM to Buffer).

In these embodiments of the present invention, the adjacent word line may include one or two word lines next to a word line corresponding to a requested address. In an embodiment, the adjacent word line may include a plurality of word lines positioned in a predetermined range from a selected word line as well as a next word line. For example, the adjacent word line may include eight, 16, or a different number of word lines around the selected word line.

In the embodiments illustrated in FIG. 2, the step S143 of temporarily suspending a current request for the word line corresponding to the requested address may be performed as the row access controller 110 temporarily suspends the operation of the arbitration block 30.

An operation of processing the temporarily-suspended current request may be performed immediately after the step S145, before the loop is ended.

In an embodiment, however, the temporarily-suspended request may not be processed after the step S145, but may be maintained in a queue storing requests so as to be processed at step S131 of the next loop.

When the semiconductor memory device 1 is a volatile memory device such as DRAM, a refresh operation may be performed on the entire or a part of the memory cell array 2 at a constant interval.

When the refresh operation is performed, the data stored in the buffer 130 may be registered in cells corresponding to the address. Through this operation, the corresponding space of the buffer 130 may be reused.

When the refresh operation is performed, the value of the count field may be reset or deleted.

Figure 8:
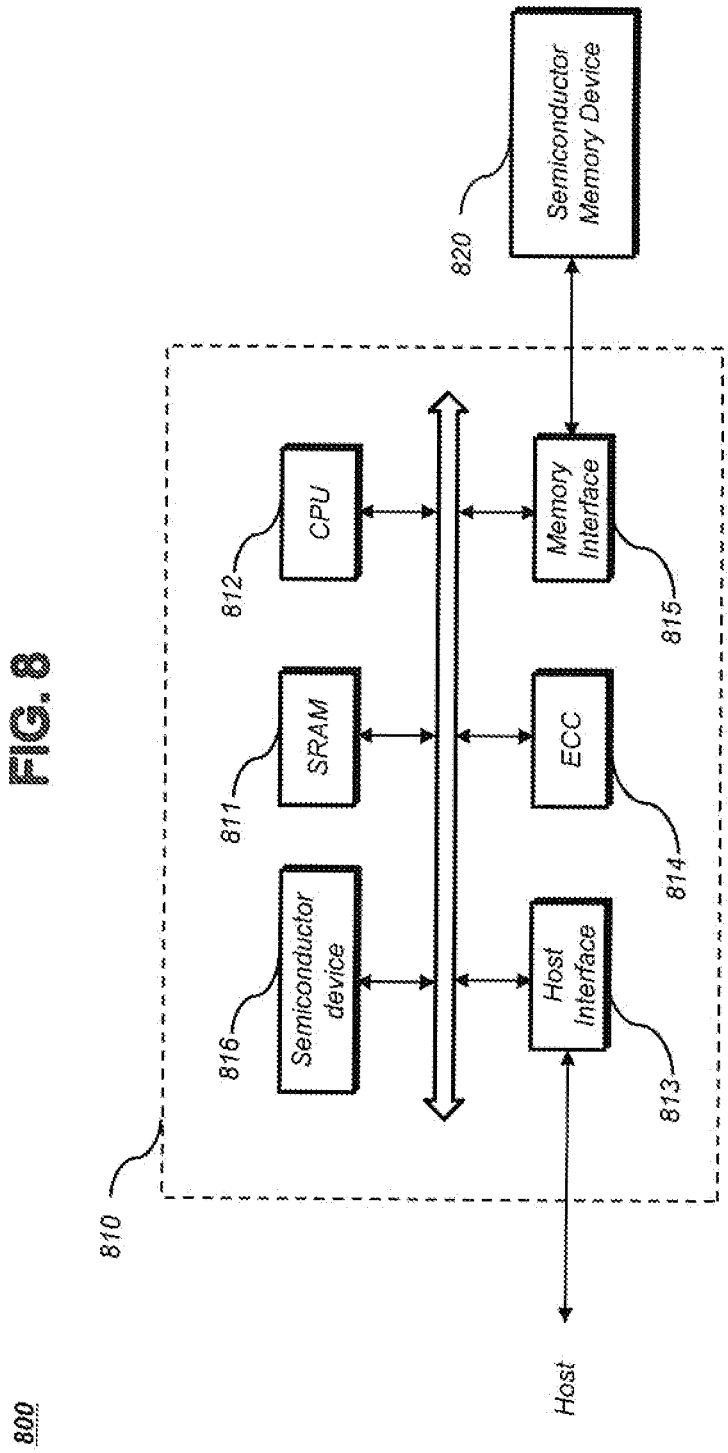
FIG. 8 is a view illustrating a memory system according to an embodiment of the present invention.

FIG. 8 is a block diagram illustrating a memory system according to an embodiment of the present invention.

In FIG. 8, the memory system 800 of the present embodiment may include a semiconductor memory device 820 and a memory controller 810.

The semiconductor memory device 820 may include the semiconductor memory devices described above with reference to FIGS. 1 through 7. As such, the semiconductor memory device 820, of memory system 800, may be configured as a nonvolatile memory device or as a volatile memory. FIG. 8 depicts a nonvolatile memory device for the semiconductor memory device 820. Additionally, the nonvolatile memory device may be a multi-chip package having flash memory chips.

The memory controller 810 includes the semiconductor devices described above with reference to FIGS. 1 through 7. As such, FIG. 8 illustrates memory controller 810 including a semiconductor device 816. The memory controller 810 controls the semiconductor memory device 820, and may include an SRAM 811, a CPU 812, a host interface 813, an ECC 814 and a memory interface 815. The SRAM 811 is used as an operation memory of the CPU 812, the CPU 812 performs control operation for data exchange of the memory controller 810, and the host interface 813 has data exchange protocol of a host accessed to the memory system 800. The ECC 814 detects and corrects error of data read from the semiconductor memory device 820, and the memory interface 815 interfaces with the semiconductor memory device 820. The memory controller 810 may include further ROM for storing data for interfacing with the host, etc.

The memory system 800 may be used as a memory card or a solid state disk SSD by combination of the semiconductor memory device 820 and the memory controller 810. In the event that the memory system 800 is the SSD, the memory controller 810 communicates with an external device, e.g. host through one of various interface protocols such as USB, MMC, PCI-E, SATA, PATA, SCSI, ESDI, IDE, etc.

Figure 9:
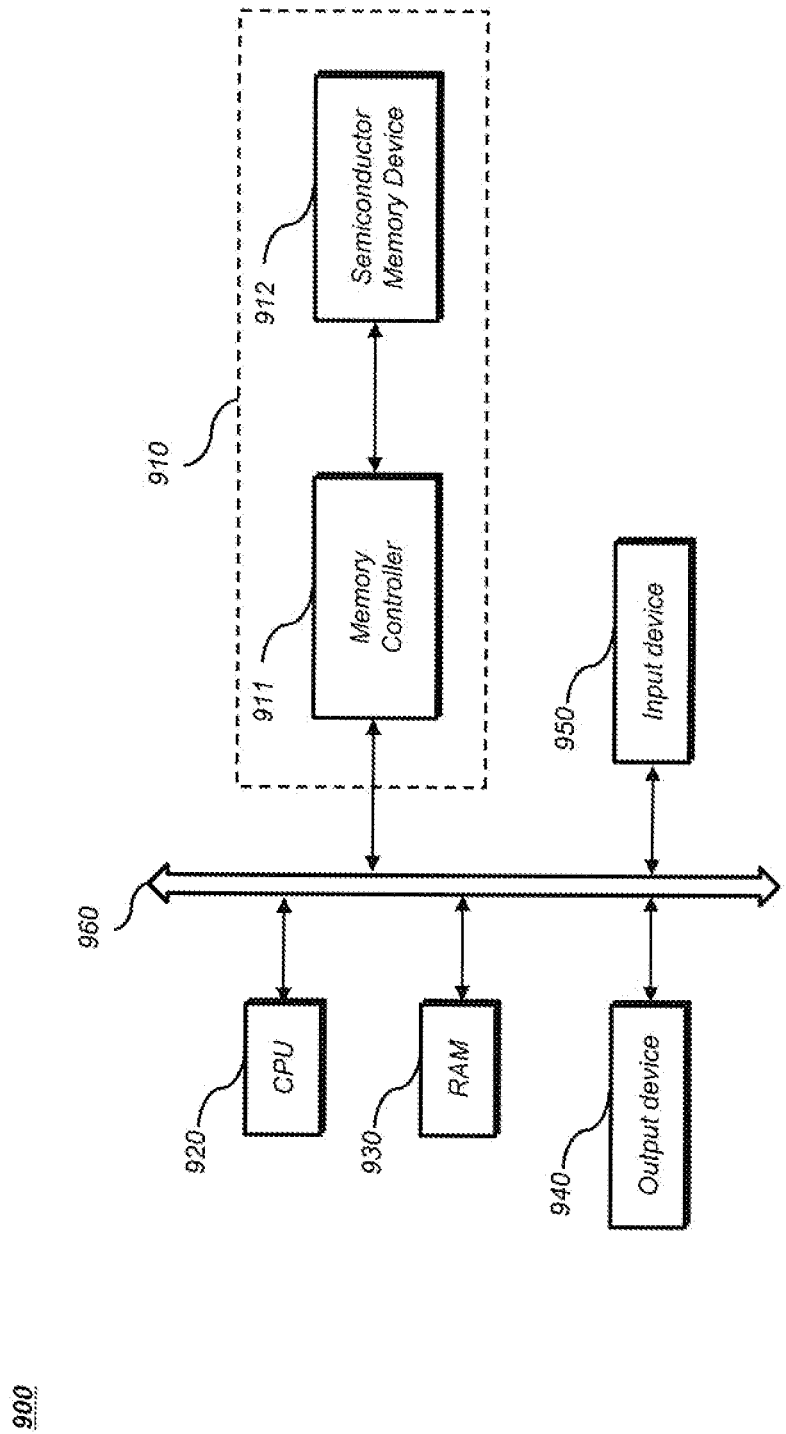
FIG. 9 is a view illustrating a computing system according to an embodiment of the present invention.

FIG. 9 is a view illustrating a computing system according to an embodiment of the present invention.

In FIG. 9, the computing system 900 of the present embodiments may include a CPU 920 connected electrically to a system bus 960, a RAM 930, an output device 940, an input device 950 and a memory system 910. In case that the computing system 900 is a mobile device, a battery (not shown) for supplying an operation voltage to the computing system 900 may be further provided. The computing system 900 of the present invention may further include an application chipset, a CMOS image processor CIS, a mobile DRAM, etc.

The output device 940 may be a self-contained display in the case of a portable electronic device. The input device 1650 may be a physical keyboard or a virtual keyboard in the case of a portable electronic device, and may further include, without limitation, a trackball, touchpad, or other cursor control device combined with a selection control, such as a pushbutton, to select an item highlighted by cursor manipulation. The memory system 910 may include a semiconductor memory device 912 and a memory controller 911 as described in FIG. 8.

In accordance with the embodiments of the present invention, it is possible to solve the data damage issue caused by word line disturbance occurring in the semiconductor memory device.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
 a controller configured to control a first memory device to process a request for the first memory device; and
 a second memory device;
 wherein the controller receives the request for the first memory device, determines a data damage risk of cells connected to a second signal line adjacent to a first signal line of the first memory device corresponding to a requested address by referring to information indicating a data damage risk, and stores data of the cells connected to the second signal line in the second memory device when determining that there is a data damage risk.

2. The semiconductor device of claim 1, wherein the controller processes the request on the second memory device instead of the first memory device, when data corresponding to the requested address exist in the second memory device.

3. The semiconductor device of claim 1, wherein the controller updates the information indicating the data damage risk when determining that there is no data damage risk.

4. The semiconductor device of claim 1, wherein the controller suspends processing the request for the first memory device when there is the data damage risk.

5. The semiconductor device of claim 4, wherein the controller resumes processing the request for the first memory device after the data is stored in the second memory device.

6. The semiconductor device of claim 1, further comprising a third memory device configured to store the information indicating the data damage risk.

7. The semiconductor device of claim 1, wherein the first memory device comprises a volatile memory device.

8. The semiconductor device of claim 7, wherein the controller resets the information indicating the data damage risk when a refresh operation was performed on the first memory device.

9. The semiconductor device of claim 1, wherein the information indicating the data damage risk comprises a number of selections for the first signal line.

10. The semiconductor device of claim 9, wherein when the number of selections for the first signal line exceeds a critical point, the controller determines that there is a data damage risk.

11. The semiconductor device of claim 9, wherein the controller resets the number of selections for the first signal line when determining that there is the data damage risk.

12. The semiconductor device of claim 9, wherein the controller updates the number of selections for the first signal line when determining that there is no data damage risk.

13. The semiconductor device of claim 1, wherein the information indicating the data damage risk comprises a count value for the second signal line.

14. The semiconductor device of claim 13, wherein when the count value for the second signal line exceeds a critical point, the controller determines that there is a data damage risk.

15. The semiconductor device of claim 13, wherein the controller resets the count value for the second signal line when determining that there is the data damage risk.

16. The semiconductor device of claim 13, wherein the controller updates the count value for the second signal line when determining that there is no data damage risk.

17. The semiconductor device of claim 16, wherein the controller resets the count value for the first signal line when determining that there is no data damage risk.

18. The semiconductor device of claim 1, wherein the first and second signal lines comprise a word line.

* * * * *